United States Patent
Rapoport

(10) Patent No.: US 9,535,141 B2
(45) Date of Patent: Jan. 3, 2017

(54) MRI SAFETY DEVICE MEANS AND METHODS THEREOF

(71) Applicant: Aspect Imaging Ltd., Shoham (IL)

(72) Inventor: Uri Rapoport, Moshav Ben Shemen (IL)

(73) Assignee: Aspect Imaging Ltd., Shoham (IL)

( * ) Notice: Subject to any disclaimer, the term of this patent is extended or adjusted under 35 U.S.C. 154(b) by 581 days.

(21) Appl. No.: 13/939,599

(22) Filed: Jul. 11, 2013

(65) Prior Publication Data

US 2014/0266203 A1    Sep. 18, 2014

Related U.S. Application Data

(60) Provisional application No. 61/778,499, filed on Mar. 13, 2013.

(51) Int. Cl.
*G01V 3/00*     (2006.01)
*G01R 33/28*    (2006.01)

(52) U.S. Cl.
CPC .................. *G01R 33/288* (2013.01)

(58) Field of Classification Search
USPC ........................................................ 324/318
See application file for complete search history.

(56) References Cited

U.S. PATENT DOCUMENTS

| | | |
|---|---|---|
| 5,565,831 A | 10/1996 | Dorri et al. |
| 5,883,558 A | 3/1999 | Laskaris et al. |
| 8,807,084 B2 | 8/2014 | Rapoport et al. |
| 8,851,018 B2 | 10/2014 | Rapoport et al. |
| 8,896,310 B2 | 11/2014 | Rapoport |
| 2003/0016518 A1* | 1/2003 | Arz ....................... H05K 9/0001 361/818 |
| 2004/0135687 A1* | 7/2004 | Keene ..................... G01V 11/00 340/551 |
| 2004/0147833 A1* | 7/2004 | Czipott .................... G01V 3/15 600/410 |
| 2005/0242817 A1* | 11/2005 | Hoult .................... G01R 33/288 324/326 |

(Continued)

FOREIGN PATENT DOCUMENTS

| | | |
|---|---|---|
| EP | 0187691 | 7/1986 |
| JP | S5961763 | 4/1984 |

(Continued)

OTHER PUBLICATIONS

Aspect Imaging Ltd., "Foamed Patient Transport Incubator", co-pending U.S. Appl. No. 14/531,289, filed Nov. 3, 2014.

(Continued)

*Primary Examiner* — Rodney Fuller
(74) *Attorney, Agent, or Firm* — Pearl Cohen Zedek Latzer Baratz LLP

(57) ABSTRACT

A magnetic shielding mechanism for preventing penetration of metallic objects through an aperture, towards the open bore of an magnetic resonance imaging device, where the magnetic field is maximized. The magnetic resonance imaging device produces a fringing magnetic field that decreases with increasing distance (L) from the aperture. The mechanism includes at least one magnet with a magnetic field. The mechanism is affixed at a distance from the aperture of magnetic resonance imaging device.

24 Claims, 6 Drawing Sheets

(56) References Cited

U.S. PATENT DOCUMENTS

| | | | |
|---|---|---|---|
| 2006/0022670 A1* | 2/2006 | Kumar | G01V 3/104 324/239 |
| 2006/0084857 A1* | 4/2006 | Massengill | G01R 33/28 600/407 |
| 2008/0122441 A1 | 5/2008 | Hayakwa | |
| 2008/0281187 A1* | 11/2008 | Massengill | A61B 5/05 600/424 |
| 2011/0162652 A1 | 7/2011 | Rapoport | |
| 2011/0186049 A1 | 8/2011 | Rapoport | |
| 2011/0234347 A1 | 9/2011 | Rapoport | |
| 2011/0304333 A1 | 12/2011 | Rapoport | |
| 2012/0071745 A1 | 3/2012 | Rapoport | |
| 2012/0073511 A1 | 3/2012 | Rapoport et al. | |
| 2012/0077707 A1 | 3/2012 | Rapoport | |
| 2012/0119742 A1 | 5/2012 | Rapoport | |
| 2013/0079624 A1 | 3/2013 | Rapoport | |
| 2013/0109956 A1 | 5/2013 | Rapoport | |
| 2013/0237803 A1 | 9/2013 | Rapoport | |
| 2013/0328559 A1 | 12/2013 | Rapoport | |
| 2013/0328560 A1 | 12/2013 | Rapoport | |
| 2013/0328563 A1 | 12/2013 | Rapoport | |
| 2014/0050827 A1 | 2/2014 | Rapoport | |
| 2014/0051973 A1 | 2/2014 | Rapoport et al. | |
| 2014/0051974 A1 | 2/2014 | Rapoport et al. | |
| 2014/0051976 A1 | 2/2014 | Rapoport et al. | |
| 2014/0099010 A1 | 4/2014 | Rapoport et al. | |
| 2014/0103927 A1 | 4/2014 | Rapoport | |
| 2014/0117989 A1 | 5/2014 | Rapoport | |
| 2014/0128725 A1 | 5/2014 | Rapoport et al. | |
| 2014/0139216 A1 | 5/2014 | Rapoport | |
| 2014/0142914 A1 | 5/2014 | Rapoport | |
| 2014/0152302 A1 | 6/2014 | Rapoport et al. | |
| 2014/0152310 A1 | 6/2014 | Rapoport | |
| 2014/0158062 A1 | 6/2014 | Rapoport et al. | |
| 2014/0230850 A1 | 8/2014 | Rapoport | |
| 2014/0257081 A1 | 9/2014 | Rapoport | |
| 2014/0266203 A1 | 9/2014 | Rapoport et al. | |
| 2014/0300358 A1 | 10/2014 | Rapoport | |
| 2014/0378821 A1 | 12/2014 | Rapoport et al. | |
| 2014/0378825 A1 | 12/2014 | Rapoport et al. | |
| 2015/0059655 A1 | 3/2015 | Rapoport | |
| 2015/0065788 A1 | 3/2015 | Rapoport | |

FOREIGN PATENT DOCUMENTS

| | | |
|---|---|---|
| JP | H04317630 | 11/1992 |
| WO | WO2004/029644 | 4/2004 |

OTHER PUBLICATIONS

Aspect Imaging Ltd., "Mechanical Clutch for MRI", co-pending U.S. Appl. No. 14/611,379, filed Feb. 2, 2015.

Aspect Imaging Ltd., "Incubator Deployable Multi-Functional Panel", co-pending U.S. Appl. No. 14/619,557, filed Feb. 11, 2015.

Aspect Imaging Ltd., "MRI Thermo-Isolating Jacket", co-pending U.S. Appl. No. 14/623,039, filed Feb. 16, 2015.

Aspect Imaging Ltd., "MRI RF Shielding Jacket", co-pending U.S. Appl. No. 14/623,051, filed Feb. 16, 2015.

Aspect Imaging Ltd., "Capsule for a Pneumatic Sample Feedway", co-pending U.S. Appl. No. 14/626,391, filed Feb. 19, 2015.

Aspect Imaging Ltd., "Incubator's Canopy with Sensor Dependent Variably Transparent Walls and Methods for Dimming Lights Thereof", co-pending U.S. Appl. No. 14/453,909, filed Aug. 7, 2014.

Aspect Imaging Ltd., "Temperature-Controlled Exchangeable NMR Probe Cassette and Methods Thereof", co-pending U.S. Appl. No. 14/504,890, filed Oct. 2, 2014.

Aspect Imaging Ltd., "NMR Extractable Probe Cassette Means and Methods Thereof", co-pending U.S. Appl. No. 14/504,907, filed Oct. 2, 2014.

Aspect Imaging Ltd., "Means for Operating an MRI Device Within a RF-Magnetic Environment", co-pending U.S. Appl. No. 14/596,320, filed Jan. 14, 2015.

Aspect Imaging Ltd., "Means and Method for Operating an MRI Device Within a RF-Magnetic Environment", co-pending U.S. Appl. No. 14/596,329, filed Jan. 14, 2015.

Aspect Imaging Ltd., "CT/MRI Integrated System for the Diagnosis of Acute Strokes and Methods Thereof", co-pending U.S. Appl. No. 14/598,517, filed Jan. 16, 2015.

Aspect Imaging Ltd., "RF Automated Tuning System Used in a Magnetic Resonance Device and Methods Thereof", co-pending U.S. Appl. No. 14/588,741, filed Jan. 2, 2015.

Aspect Imaging Ltd., "MRI With Magnet Assembly Adapted for Convenient Scanning of Laboratory Animals With Automated RF Tuning Unit", co-pending U.S. Appl. No. 14/581,266, filed Dec. 23, 2014.

Aspect Imaging Ltd., "A Method for Providing High Resolution, High Contrast Fused MRI Images", co-pending U.S. Appl. No. 13/877,553, filed Apr. 3, 2013.

Aspect Imaging Ltd., "A Method for Manipulating the MRI's Protocol of Pulse-Sequences", co-pending U.S. Appl. No. 14/070,695, filed Nov. 4 2013.

Aspect Imaging Ltd, "MRI—Incubator's Closure Assembly", co-pending U.S. Appl. No. 14/539,442, filed Nov. 12, 2014.

Rapoport, URI, "RF Shielding Conduit in an MRI Closure Assembly", co-pending U.S. Appl. No. 14/574,785, filed Dec. 18, 2014.

Aspect Imaging Ltd., "System and Method for Generating Invasively Hyperpolarized Images", co-pending U.S. Appl. No. 14/556,682, filed Dec. 1, 2014.

Aspect Imaging Ltd., "System and Method for Generating Invasively Hyperpolarized Images", co-pending U.S. Appl. No. 14/556,654, filed Dec. 1, 2014.

Aspect Imaging Ltd., "Shutting Assembly for Closing an Entrance of an MRI Device", co-pending U.S. Appl. No. 14/540,163, filed Nov. 13, 2014.

Aspect Imaging Ltd., "Cage in a MRD with a Fastening/Attenuating System", co-pending U.S. Appl. No. 14/527,950, filed Oct. 30, 2014.

International search report for PCT application No. PCT/IL2014/050245 dated, Jul. 25, 2014.

* cited by examiner

MRI SAFETY DEVICE MEANS AND METHODS THEREOF

CROSS-REFERENCE TO RELATED APPLICATIONS

This application claims the benefit of U.S. Provisional Patent Application No. 61/778,499, filed Mar. 13, 2013, which is hereby incorporated by reference.

FIELD OF THE INVENTION

The present invention pertains to safety during imaging procedures related to magnetic fields and more particularly to protection of personnel and equipment involved in MRI diagnosis.

BACKGROUND OF THE INVENTION

In general, the static magnetic fields in MRI systems may be more than about 0.5 T; some such systems have static magnetic fields greater than 3 T. These magnetic fields will attract metal objects in the vicinity of the static magnets. If the object is in the vicinity of the MRI's opening, such as an opening to allow entrance of a subject to be analyzed, the object can become very difficult to remove from the interior of the MRI. Worse, in an MRI located within the hospital, for imaging patients, such a magnetic fringing field can be physically dangerous to the patient, if not fatal.

Fringe fields from a high field strength can extend to a distance determines roughly by the equation $X=\alpha B_0$, where $\alpha$ is a constant dependent on the magnet bore size and magnet configuration. An unshielded 1.5 T magnet has a 1 mT fringe field at a distance of ~9.3 m, a 0.5 mT field at 11.5 m, and a 0.3 mT field at 14.1 m from the center of the magnet. To reduce the extent of the magnetic fringe field, passive (such as thick metal walls close to the magnet) and active (electromagnet systems placed in the magnet housing, superconductive magnets U.S. Pat. Nos. 5,883,558, 5,565,831 magnetic shielding are applied. The distance of a shielded fringe field surrounding the MRD opening can be reduced to about 2 meters or less.

Despite the achievable reduction of the magnetic fringe field boundaries, the existence of such field provides room for the above mentioned dangers in the MRD vicinity. Therefore, there is a long-felt need to provide an automatic and safe means of preventing loose metal objects from entering the fringe field and the MRD bore and protecting the patients from metallic instruments.

SUMMARY OF THE INVENTION

It is an object of the present invention to disclose a system for magnetic shielding mechanism (MSM) for avoiding penetration of metallic objects throughout an aperture, towards the open bore of an MRI device (MRD), where the magnetic field (B) is maximized; the MRD produces fringing magnetic field ($B_{F/L}$) which decreases with increasing distance (L) from the aperture; the MSM comprising at least one magnet with a magnetic field $B_{MSM}$; the MSM is affixed at a distance $L_{MSM}$ from the MRD's aperture; wherein at any distance L, $B_{MSM} \gg B_{F/L}$.

It is another object of the present invention wherein the MSM as defined in any of the above is configured as a rim, at least partially encircling the open bore.

It is another object of the present invention wherein the MSM as defined in any of the above comprises an array of a plurality of magnets disposed along at least a part of the circumference of the rim.

It is another object of the present invention wherein the MSM as defined in any of the above is in connection with a horizontal patient bed or a gantry (together defined as 'gantry') configured to reversibly reciprocally maneuver into and out of the open bore, along the main longitudinal axis of the same, wherein the MSM is adapted to one of a group consisting of (i) encircle at least a portion of the gantry, (ii) located in connection to the gantry, (iii) be comprised within or on top at least a portion of the gantry and a combination thereof.

It is another object of the present invention wherein the MSM as defined in any of the above comprises a plurality of magnets.

It is another object of the present invention wherein the MSM as defined in any of the above comprises a plurality of magnets are provided in an array.

It is another object of the present invention wherein the MSM as defined in any of the above comprises metallic objects selected from a group consisting of medical devices, needles and surgical instruments, laboratory items, dressware, garments, and foot-ware, ferrous-based materials, nickel alloys and stainless steel of ferritic and martensitic crystalline structure and any combination thereof.

It is another object of the present invention wherein the MSM as defined in any of the above comprises communication means thereby providing a remote connection with an MRD.

It is another object of the present invention wherein the MSM as defined in any of the above is in connection with an alarming mechanism in communication with at least one MSM, and further wherein at least one MSM is provided in connection to a gate alarming when metallic instrument penetrate via the gate.

It is another object of the present invention wherein the MSM as defined in any of the above is in connection with an MRD-guard mechanism (GM), the GM is selected from a group consisting of (i) MRD's aperture-blocking mechanism, (ii) magnetic field shutter, (iii) one or more MSMs, and a combination thereof, wherein the alarming mechanism in communication with the GM when a metallic instrument penetrate via the gate.

It is another object of the present invention wherein the MSM as defined in any of the above is in communication with a metal detector.

It is another object of the present invention wherein the MSM as defined in any of the above MSM is portable.

It is another object of the present an MRD, comprising one or more magnetic MSMs for avoiding penetration of metallic objects throughout an aperture, towards the open bore of the MRD where the magnetic field (B) is maximized; the MRD produces fringing magnetic field ($B_{P/L}$) which decreases with increasing distance (L) from the aperture; wherein the MSM comprising at least one magnet with a magnetic field $B_{MSM}$; wherein the MSM is affixed at a distance $L_{MSM}$ from the MRD's aperture; and further wherein at any distance L, $B_{MSM} \gg B_{F/L}$.

It is another object of the present invention wherein the MRD as defined in any of the above comprises an MSM which is configured as a rim, at least partially encircling the open bore.

It is another object of the present invention wherein the MRD comprises an array of a plurality of magnets disposed along at least a part of the circumference of the rim.

It is another object of the present invention wherein the MRD as defined in any of the above, the MRD additionally comprises a horizontal patient bed or a gantry configured to reversibly reciprocally maneuver into and out of the open bore, along the main longitudinal axis of the same, wherein the MSM is adapted to one of a group consisting of (i) encircle at least a portion of the gantry, (ii) be located in connection to the gantry, (iii) be comprised within or on top at least a portion of the gantry and a combination thereof.

It is another object of the present invention wherein the MRD as defined in any of the above comprises an MSM and the MSM comprises a plurality of magnets.

It is another object of the present invention wherein the MRD as defined in any of the above comprises an MSM, wherein, in the aforesaid MSM, the plurality of magnets is provided in an array.

It is another object of the present invention wherein the MRD as defined in any of the above wherein the metallic objects are selected from a group consisting of medical devices, needles and surgical instruments, laboratory items, dress-ware, garments, and foot-ware, ferrous-based materials, nickel alloys and stainless steel of ferritic and martensitic crystalline structure and any combination thereof.

It is another object of the present invention wherein the MRD as defined in any of the above is in a remote connection with an MSM as defined above.

It is another object of the present invention wherein the MRD as defined in any of the above which comprises an alarming mechanism in communication with at least one MSM, wherein at least one MSM is provided in connection to a gate alarming when metallic instrument penetrate via the gate.

It is another object of the present invention wherein the MRD as defined in any of the above further comprises an MRD-guard mechanism (GM), the GM is selected from a group consisting of (i) MRD's aperture-blocking mechanism, (ii) magnetic field shutter, (iii) one or more MSMs, and a combination thereof, wherein the alarming mechanism is in communication with the GM when a metallic instrument penetrates via the gate.

It is another object of the present invention wherein the MRD as defined in any of the above is in connection with an MSM which is in communication with a metal detector.

It is another object of the present invention wherein the MRD as defined in any of the above wherein the MSM is portable.

BRIEF DESCRIPTION OF THE FIGURES

In order to better understand the invention and its implementation in practice, a plurality of embodiments will now be described, by way of non-limiting example only, with reference to the accompanying drawings, wherein

FIG. 6A illustrates MRD (110) which is in connection with a portable or otherwise moveable MSM that can be configured in more than one predefined location while

DETAILED DESCRIPTION OF THE PREFERRED EMBODIMENTS

The following description is provided, alongside all chapters of the present invention, so as to enable any person skilled in the art to make use of the invention and sets forth the best modes contemplated by the inventor of carrying out this invention. Various modifications, however, will remain apparent to those skilled in the art, since the generic principles of the present invention have been defined specifically to provide a means and method for avoiding penetration of metallic objects throughout an aperture, towards the open bore of an MRI device.

The term "metallic objects" refers hereinafter to any metal that produces a magnetic field in response to an applied magnetic field such as ferromagnetic and ferrimagnetic metals.

Figure 1:
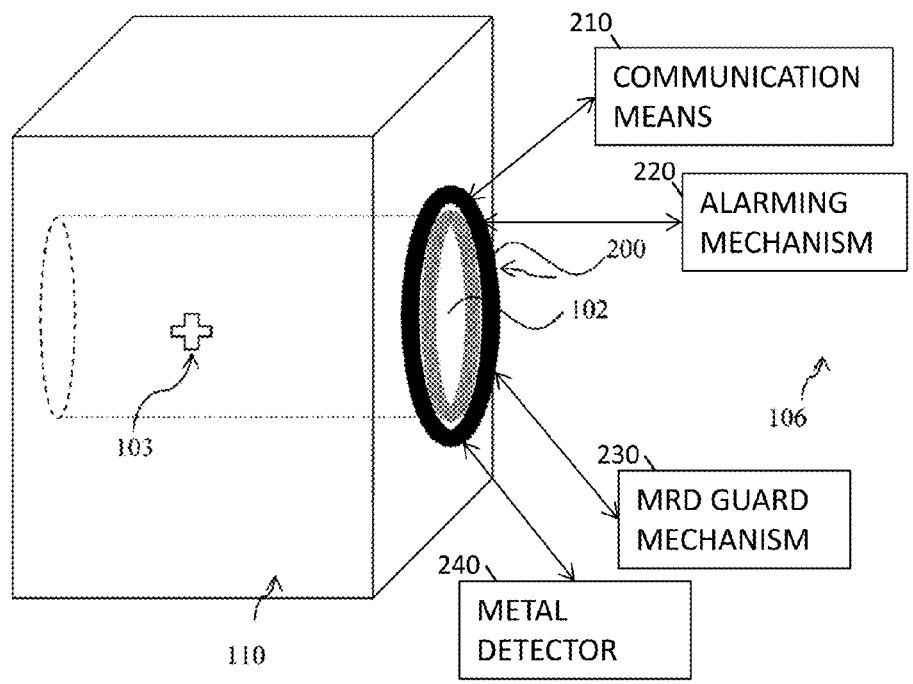
FIG. 1, illustrates (see upper figure) a schematic cross section (side view) of an MRI device (110) having an open bore with a volume of interest (103), where maximal magnetic field is applied and an MSM (200) adjacent to the aperture of the bore; lower curve shows the strength of the magnetic field as a function of the distance between the center of the VOI (103, where maximal magnetic field is applied, 104) and a theoretical line provided throughout bore's opening (102, where a much less infringing magnetic field, namely, the magnetic field outside the magnet itself, is applied, 105), and the outer environment (106, where zero magnetic field is applied, 107) surrounding the MRD (110)
Figure 1:
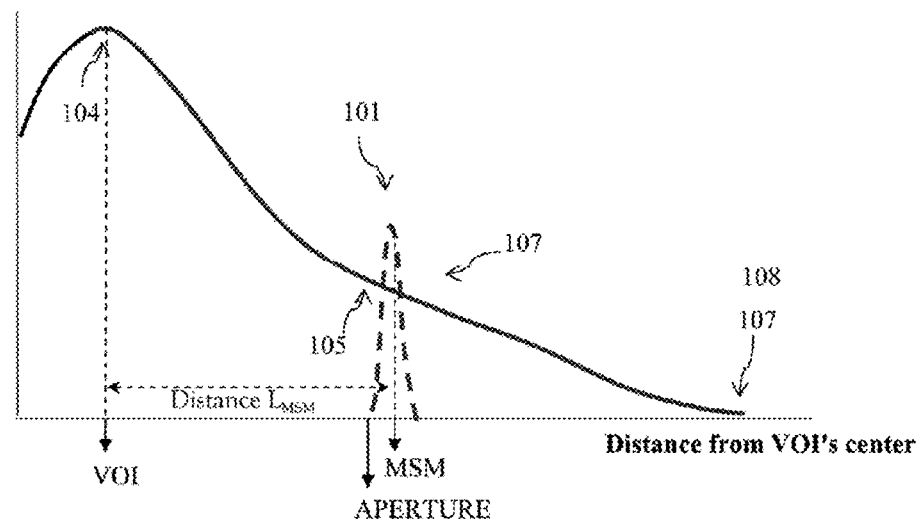

Reference is made now to FIG. 1, illustrating (see upper figure) a schematic cross section (side view) of an MRI device (110) having an open bore with a volume of interest (103) where maximal magnetic field is applied. The bore has an aperture (102), via which the patient is examined. FIG. 1, further illustrates (see lower curve) the strength of the magnetic field as a function of the distance between the center of the VOI (103, where maximal magnetic field is applied, 104) and a theoretical line provided throughout bore's opening (102, where a much less infringing magnetic field, namely, the magnetic field outside the magnet itself, is applied, 105), and the outer environment (106, where zero magnetic field is applied, 107) surrounding the MRD (110). FIG. 1 further illustrates, according to one embodiment of the invention, a ring-shaped magnetic shielding member (MSM, 200) located in at the outside portion of the MRD, adjacent to the rim of the bore's opening (102). The magnetic strength of (101, see lower curve) of MSM (120) is effectively higher than the fringing magnetic fields (ibid., 105) of the MRD. Metallic instruments accidently provided adjacent the opening 102 will thus magnetically be pulled in a safe manner towards MSM 200 rather than magnetically attracted to penetrate aperture 102 towards the MRD's magnet located within the open bore.

Reference is still made to FIG. 1, showing an example of the invention: The magnetic shielding mechanism (MSM, 200) is especially adapted for avoiding dangerous penetration of metallic objects such a surgical tools, medical devices and sharp instruments throughout an aperture (102), towards the open bore of an MRI device (MRD, 110), where the magnetic field (B, 104) is maximized The MRD comprises fringing magnetic field (BP/L, 105) which decreases with increasing distance (L, x-axis of the curve) from aperture (102). MSM (200) comprises at least one magnet with a magnetic field BMSM (101). The MSM is affixed at a distance LMSM from said MRD's VOI, outside the MED;

here for example, the distance between the aperture and the MSM is approximately zero; wherein at any distance L, $B_{MSM} \gg B_{F/L}$. MSM 200 may comprise communication means 210 thereby providing a remote connection with MRD 110. MSM 200 may be in connection with an alarming mechanism 220, which is in communication with MSM 200. MSM 200 may be in connection with a MRD-guard mechanism 230. MSM 200 may be in connection with a metal detector 240.

Figure 2A:
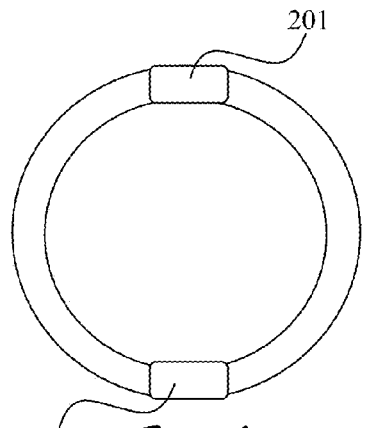
FIG. 2A to 2F, illustrate schematic front views of a few MSMs according to several embodiments of the invention.
Figure 2B:
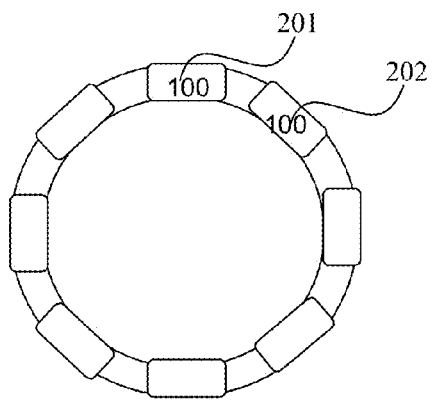
Figure 2C:
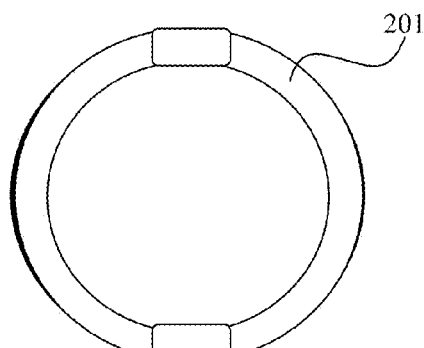
Figure 2D:
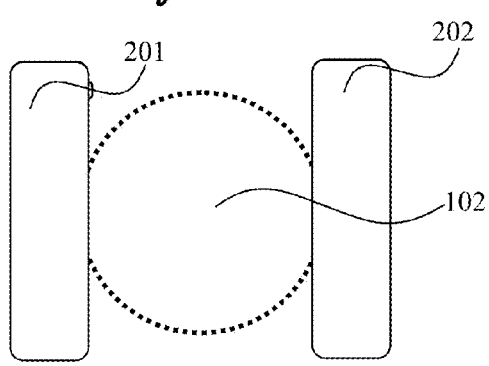
Figure 2E:
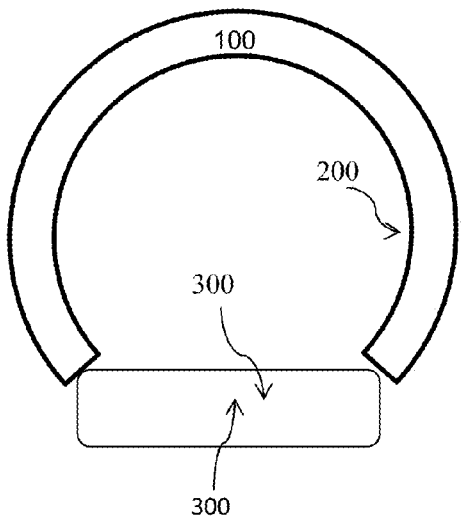
Figure 2F:
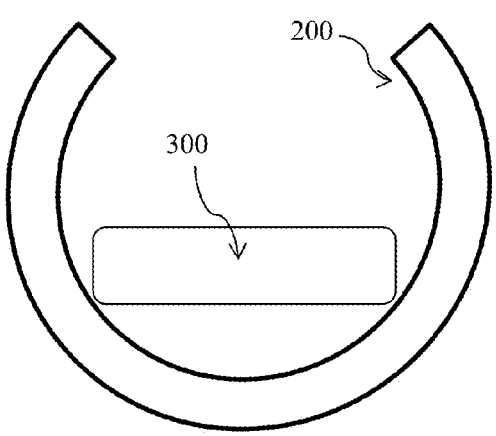

Reference is made now to FIG. 2A to 2F, illustrating schematic front views of some of the embodiments of the invention. FIG. 2A presents one configuration of MSM (200) comprising as an example an upper magnet 201 and/or a lower magnet 202. FIG. 2B presents another configuration of MSM (200) comprising a plurality of magnets (201, 202 etc). FIG. 2B presents another configuration of MSM (200), comprising one or more continuous shaped magnets (201, 202). FIG. 2B presents another configuration of MSM (200), namely a gate-like MSM comprising one or more magnets (201, 202) located outside the bore's aperture (102). FIG. 2E and FIG. 2F present, still in a non limiting manner, other configurations of MSM (200), here, a ring-like MSM is provided above or at least partially around an MRD's gantry, horizontal patient bed and the like (300).

Figure 3:
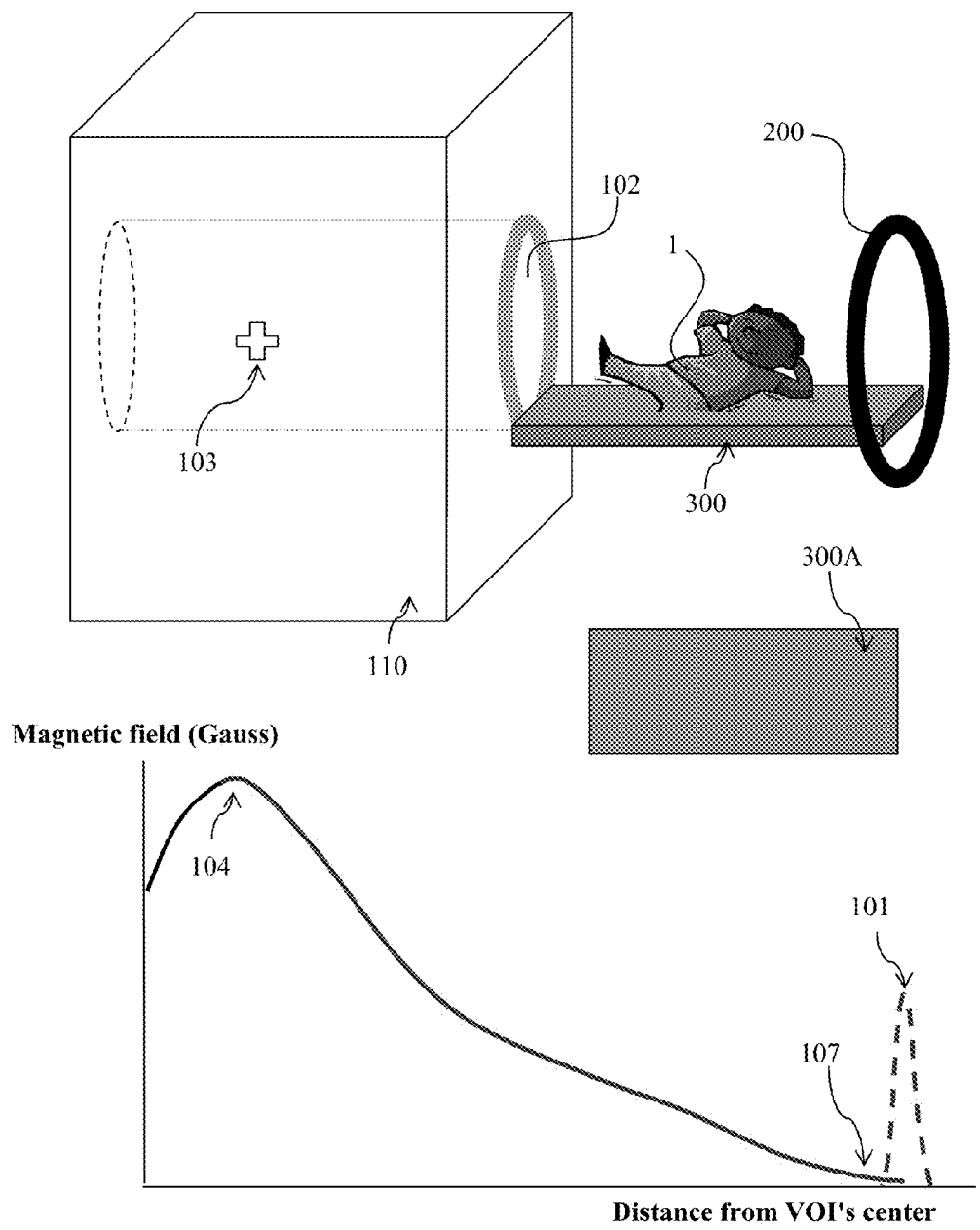
FIGS. 3 and 4 illustrate schematic perspective views of other embodiments of the invention; MRD (110) in connection with a gantry (300) where patients (1) are placed before their imaging within the MRD; an MSM (200) is in connection with the gantry.

Reference is made now to FIG. 3, illustrating a schematic perspective view of another embodiment of the invention. MRD (110) in connection with a gantry (300) where patients (1) are placed before their imaging within the MRD (110). According to this embodiment of the invention, an MSM (200), is in connection with said gantry, e.g., positioned opposite to the MRD's aperture (102). The magnetic strength (101) of the MSM (200) is effectively stronger than the fringing magnetic field (107) at its location and significantly weaker than the magnetic field (104) applied in the VOI (103). Moreover, the magnetic field curve (101) of the MSM (200) is very sharp. Top view of the magnetic gantry (300) is given at view 300A.

Figure 4:
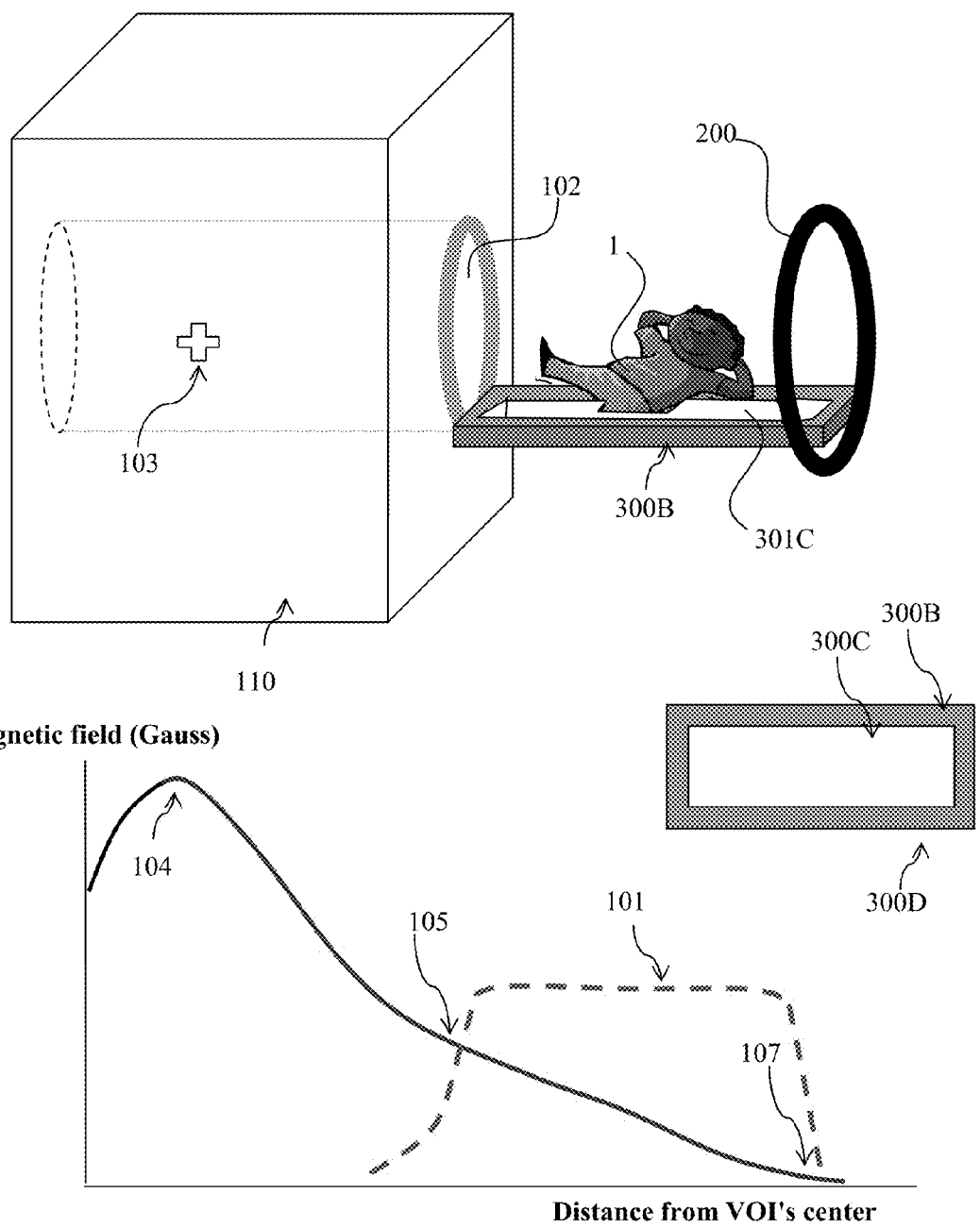

Reference is made now to FIG. 4, illustrating a schematic perspective view of another embodiment of the invention. An MRD (110) in connection with a gantry (300) of another type. According to this embodiment of the invention, as described above, MSM (200) is in connection with said gantry, e.g., positioned in opposite to the MRD's aperture (102). As shown separately in a top schematic view, gantry (300D) comprises a magnetic rim (300B) at the circumference of a non-magnetic portion of the gantry (300C). The magnetic strength (101) of the MSM (200) is effectively stronger than the fringing magnetic field at its location (105-107) and significantly weaker than the magnetic field (104) applied in the VOI (103). The magnetic field curve (101) of the MSM (200) has a broad shape.

Figure 5:
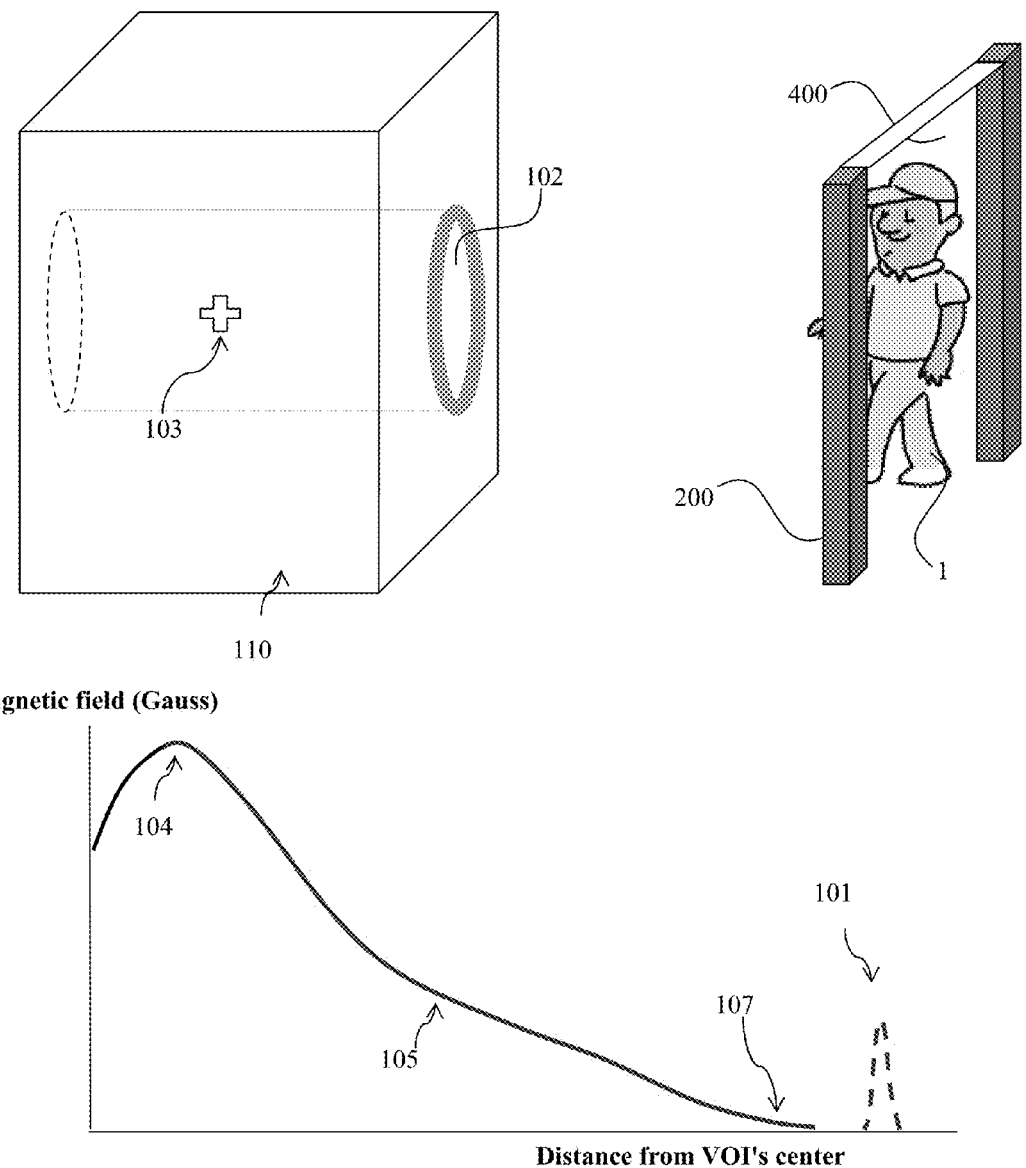
FIG. 5 illustrates gate (400) to an MRD (110) and/or MRD's cabinet, the gate is in connection with an MSM (200)

Reference is made now to FIG. 5, illustrating a schematic perspective view of another embodiment of the invention. A gate (400) to an MRD (110) and/or MRD's cabinet is in connection with an MSM (200). Patient to be imaged is guided to pass said MSM before approaching the MRD's adjacent environment. The magnetic field (101) within gate (400) is significantly greater than the magnetic fringing field (107) at that location.

Figure 6A:
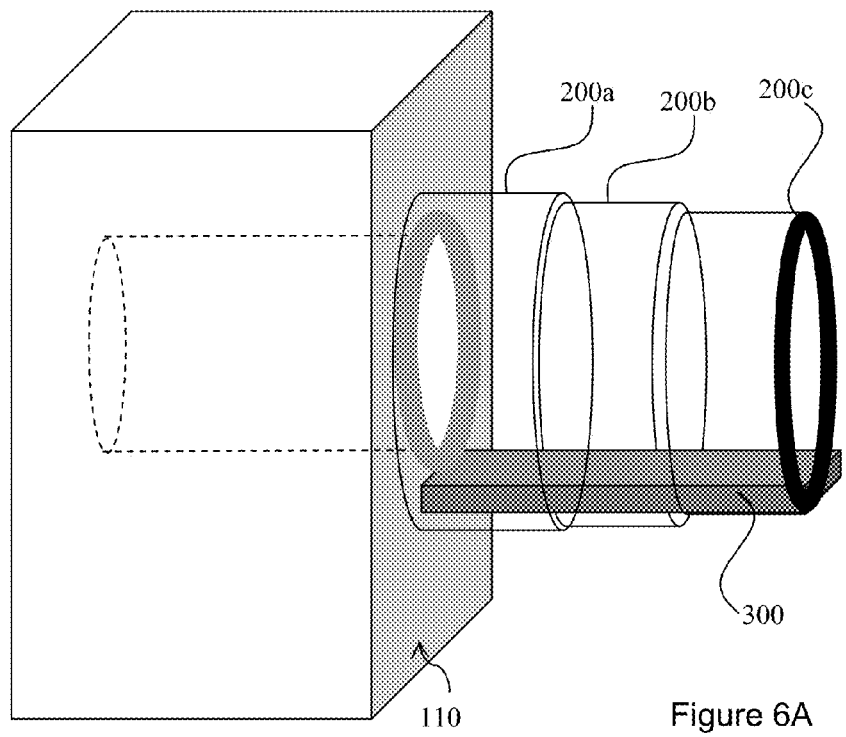
Figure 6B:
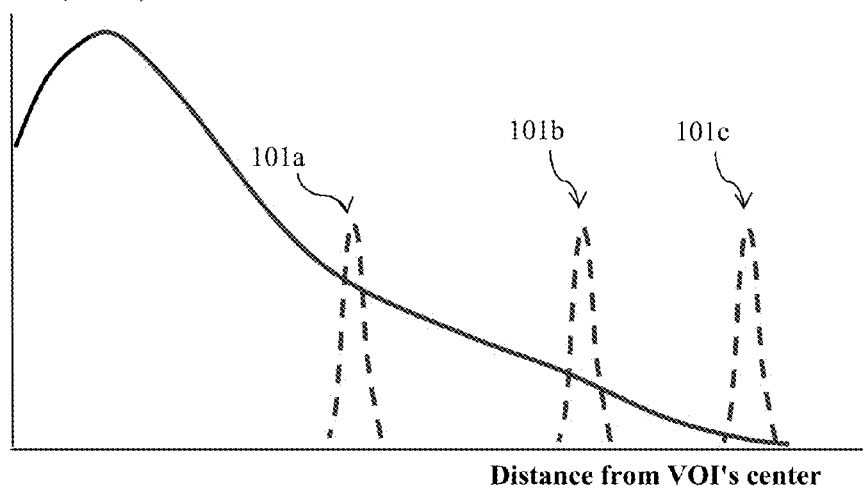
FIG. 6B illustrates the strength of the magnetic field as a function of the distance between the center of the VOI (103).

Reference is made now to FIG. 6A, illustrating a schematic perspective view of another embodiment of the invention. MRD (110) is in connection with a portable or otherwise moveable MSM, which can be configured in more than one predefined location. In one example of the invention, MSM is situated close to MED's bore opening (e.g., at the bore's aperture or in adjacent to the aperture) at location 200a, along the MRD's gantry (300) at location 200b or at respectively remote location 200c, near gantry's end. In one embodiment of the invention, MSM is reversibly reciprocated by means of telescopic mechanical mechanism, by one or more levers or transformation means or in any other useful mechanism. FIG. 6B illustrates the strength of the magnetic field as a function of the distance between the center of the VOI.

The invention claimed:

1. A magnetic shielding mechanism (MSM) for avoiding penetration of metallic objects throughout an aperture, towards the open bore of an MRI device (MRD), where the magnetic field (B) is maximized; said MRD produces fringing magnetic field ($B_{F/L}$) which decreases with increasing distance (L) from said aperture; said MSM comprising at least one magnet with a magnetic field $B_{MSM}$; said MSM is affixed at a distance $L_{MSM}$ from said MRD's aperture; wherein at any distance L, $B_{MSM} \gg B_{F/L}$.

2. The MSM of claim 1, wherein said MSM is configured as a rim, at least partially encircling said open bore.

3. The MRD of claim 2, wherein said MSM comprises a plurality of magnets.

4. The MSM of claim 1, wherein said MSM comprises an array of a plurality of magnets disposed along at least a part of the circumference of said rim.

5. The MSM of claim 1, wherein said MSM is in connection with a gantry as configured to reversibly and reciprocally maneuver into and out of said open bore, along the main longitudinal axis of same, wherein said MSM is adapted to one of a group consisting of (i) encircle at least a portion of said gantry, (ii) located in connection to said gantry, (iii) be comprised within or on top at least a portion of said gantry and a combination thereof.

6. The MSM of claim 1, wherein said plurality of magnets are provided in an array.

7. The MSM of claim 1, wherein said metallic objects are selected from a group consisting of medical devices, needles and surgical instruments, laboratory items, dress-ware, garments, and foot-ware, ferrous-based materials, nickel alloys and stainless steel of ferritic and martensitic crystalline structure and any combination thereof.

8. The MSM of claim 1, comprising communication means thereby providing a remote connection with an MRD.

9. The MSM of claim 1, wherein said MSM is in connection with an alarming mechanism in communication with at least one MSM, and further wherein at least one MSM is provided in connection to a gate alarming when metallic instrument penetrate via said gate.

10. The MSM of claim 1, wherein said MSM is in connection with an MRD-guard mechanism (GM), said GM is selected from a group consisting of (i) MRD's aperture-blocking mechanism, (ii) magnetic field shutter, (iii) one or more MSMs, and a combination thereof, wherein said alarming mechanism in communication with said GM when a metallic instrument penetrate via said gate.

11. The MSM of claim 1, wherein said MSM is in communication with a metal detector.

12. The MSM of claim 1, wherein said MSM is portable.

13. An MRD system, wherein said MRD is in a remote connection with an MSM as defined in claim 1.

14. The MRD system of claim 13, comprising an alarming mechanism in communication with at least one MSM, wherein at least one MSM is provided in connection to a gate alarming when metallic instrument penetrate via said gate.

15. The MRD system of claim 14, further comprising an MRD-guard mechanism (GM), said GM is selected from a group consisting of (i) MRD's aperture-blocking mechanism, (ii) magnetic field shutter, (iii) one or more MSMs, and a combination thereof, wherein said alarming mechanism in communication with said GM when a metallic instrument penetrate via said gate.

16. A magnetic resonance device (MRD), comprising one or more magnetic shielding mechanisms (MSMs) for avoiding penetration of metallic objects throughout an aperture, towards the open bore of said MRD where the magnetic field (B) is maximized; said MRD produces fringing magnetic field ($B_{F/L}$) which decreases with increasing distance (L) from said aperture; wherein said MSM comprising at least one magnet with a magnetic field $B_{MSM}$; wherein said MSM is affixed at a distance $L_{MSM}$ from said MRD's aperture; and further wherein at any distance L, $B_{MSM} \gg B_{F/L}$.

17. The MRD of claim 16, wherein said MSM is configured as a rim, at least partially encircling said open bore.

18. The MRD of claim 16, wherein said MSM comprises an array of a plurality of magnets disposed along at least a part of the circumference of said rim.

19. The MRD of claim 16, additionally comprising a gantry configured to reversibly reciprocally maneuver into and out of said open bore, along the main longitudinal axis of the same, wherein said MSM is adapted to one of a group consisting of (i) encircle at least a portion of said gantry, (ii) located in connection to said gantry, (iii) be comprised within or on top at least a portion of said gantry and a combination thereof.

20. The MRD of claim 16, wherein said MSM comprises a plurality of magnets.

21. The MRD of claim 20, wherein said plurality of magnets are provided in an array.

22. The MRD of claim 16, wherein said metallic objects are selected from a group consisting of medical devices, needles and surgical instruments, laboratory items, dressware, garments, and foot-ware, ferrous-based materials, nickel alloys and stainless steel of ferritic and martensitic crystalline structure and any combination thereof.

23. The MRD of claim 16, wherein said MSM is in communication with a metal detector.

24. The MRD of claim 16, wherein said MSM is portable.

* * * * *